US012801825B2

(12) United States Patent
Kim et al.

(10) Patent No.: US 12,801,825 B2
(45) Date of Patent: Nov. 17, 2026

(54) METHOD OF DESIGNING SEMICONDUCTOR DEVICE INTEGRATED CIRCUIT AND LAYOUT THEREOF

(71) Applicant: Samsung Electronics Co., Ltd., Suwon-si (KR)

(72) Inventors: Sunghoon Kim, Suwon-si (KR); Kiwon Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 580 days.

(21) Appl. No.: 18/465,529

(22) Filed: Sep. 12, 2023

(65) Prior Publication Data

US 2024/0169138 A1 May 23, 2024

(30) Foreign Application Priority Data

Nov. 22, 2022 (KR) ........................ 10-2022-0157504

(51) Int. Cl.

*G06F 30/398* (2020.01)
*G06F 30/20* (2020.01)
*G06F 30/33* (2020.01)
*G06F 30/367* (2020.01)
*G06F 30/392* (2020.01)
*G06F 30/394* (2020.01)

(52) U.S. Cl.

CPC .......... *G06F 30/398* (2020.01); *G06F 30/392* (2020.01); *G06F 30/394* (2020.01); *G06F 30/20* (2020.01); *G06F 30/33* (2020.01); *G06F 30/367* (2020.01)

(58) Field of Classification Search

CPC .... G06F 30/398; G06F 30/392; G06F 30/394; G06F 30/367; G06F 30/337; G06F 30/33; G06F 30/20

USPC ....... 716/122, 123, 129, 130, 132, 136, 111; 703/14

See application file for complete search history.

(56) References Cited

U.S. PATENT DOCUMENTS 6,305,000 B1 * 10/2001 Phan ....................... G06F 30/39 716/120
6,560,766 B2 5/2003 Pierrat et al.
7,185,303 B2 2/2007 Fukasawa
(Continued)

FOREIGN PATENT DOCUMENTS

JP 2003-209172 A 7/2003
JP 2004-252622 A 9/2004
(Continued)

*Primary Examiner* — Phallaka Kik
(74) *Attorney, Agent, or Firm* — HARNESS, DICKEY & PIERCE, P.L.C.

(57) ABSTRACT

A method of designing a layout of a semiconductor device includes receiving an input layout of the device, scoring the input layout, determining whether to rearrange at least one device of the semiconductor device based on the scoring, and generating an output layout based on a rearrangement. The scoring includes calculating a first area occupied by one or more devices included in the semiconductor device in the input layout, calculating a second area of a manufacturing process based on a design rule for the one or more devices and the first area, calculating a void area of the input layout based on the first area and the second area, and calculating a score of the input layout based on the void area.

20 Claims, 14 Drawing Sheets

(56) References Cited

U.S. PATENT DOCUMENTS

| | | | | |
|---|---|---|---|---|
| 8,826,197 | B2 * | 9/2014 | Muddu | G06F 30/39 716/55 |
| 9,672,320 | B2 | 6/2017 | Chang et al. | |
| 9,672,611 | B2 | 6/2017 | Yang et al. | |
| 10,866,508 | B2 | 12/2020 | Hu et al. | |
| 2003/0088849 | A1 * | 5/2003 | Yamauchi | G06F 30/39 716/52 |
| 2004/0163068 | A1 | 8/2004 | Fukita et al. | |
| 2006/0225016 | A1 * | 10/2006 | Fukasawa | G06F 30/39 257/E27.105 |
| 2008/0163134 | A1 * | 7/2008 | Nequist | G06F 30/392 716/132 |
| 2010/0127782 | A1 * | 5/2010 | Karp | G06F 30/36 330/253 |
| 2016/0180002 | A1 * | 6/2016 | Park | G06F 30/392 716/111 |
| 2025/0061261 | A1 * | 2/2025 | Wang | G06F 30/392 |

FOREIGN PATENT DOCUMENTS

| | | | | |
|---|---|---|---|---|
| JP | 2005-267291 | A | 9/2005 | |
| JP | 2006-277668 | A | 10/2006 | |
| JP | 2006-337668 | A | 12/2006 | |
| JP | 2007257373 | A | 10/2007 | |
| JP | 2010-044689 | A | 2/2010 | |
| JP | 4778339 | B2 | 9/2011 | |
| KR | 100437980 | B1 * | 7/2004 | G06F 30/398 |
| KR | 10-2018-0127141 | A | 11/2018 | |

* cited by examiner

1010

| Region | Layout |
|---|---|
| A | 10 |
| B | 210 |
| C | 15 |
| Score | 94 |

1110

| Region | Layout |
|---|---|
| A | 10 |
| B | 220 |
| C | 15 |
| Score | 88 |

METHOD OF DESIGNING SEMICONDUCTOR DEVICE INTEGRATED CIRCUIT AND LAYOUT THEREOF

CROSS-REFERENCE TO RELATED APPLICATION

This application is based on and claims priority under 35 U.S.C. § 119 to Korean Patent Application No. 10-2022-0157504, filed on Nov. 22, 2022, in the Korean Intellectual Property Office, the disclosure of which is incorporated by reference herein in its entirety.

BACKGROUND

Various example embodiments relate to a method of designing an integrated circuit (IC) and a layout thereof, and more particularly, to a method of designing a layout based on scoring of the layout.

As semiconductor manufacturing process technology has developed, the size of chips has gradually decreased and the number of elements included in ICs has continuously increased. For example, system-on-chips (SoCs) including components of different electronic systems have been widely used, and ICs including more components have been in demand.

Accordingly, as the chip size has decreased as described above, the difficulty and/or importance of a process of manufacturing semiconductor apparatuses have also increased. In order to increase the degree of integration, there is a demand or desire for a method of more efficiently utilizing a usable area.

SUMMARY

Various example embodiments provide an integrated circuit (IC) having an improved or optimized layout, and/or a method of designing a layout of the IC.

According to some example embodiments, there is provided a method of designing a layout of a semiconductor device includes receiving an input layout of the semiconductor device, scoring the input layout, determining whether to rearrange at least one device of the semiconductor device based on the scoring, and generating an output layout based on a rearrangement. The scoring includes calculating a first area occupied by one or more devices included in the semiconductor device in the input layout, calculating a second area of a manufacturing process based on a design rule for the one or more devices and the first area, calculating a void area of the input layout based on the first area and the second area, and calculating a score of the input layout based on the void area.

Alternatively or additionally according to some example embodiments, there is provided a method of realizing a computer for a layout design of an integrated circuit including receiving an input layout of the integrated circuit, calculating a first area occupied by one or more devices included in the integrated circuit in the input layout, calculating a second area of a manufacturing process based on a design rule for the one or more devices and the first area, calculating a void area of the input layout based on the first area and the second area, calculating a score of the input layout based on the first area, the second area, and the void area, comparing the score of the input layout with a threshold value, and performing routing on the integrated circuit based on a comparison result.

Alternatively or additionally according to some example embodiments, there is provided a method of a layout design of an integrated circuit including receiving an input layout of the integrated circuit, calculating a score of the input layout, comparing the score of the input layout with a reference score, and determining whether to rearrange the integrated circuit based on a comparison result. The calculating of the score includes calculating a first area occupied by one or more devices included in the integrated circuit in the input layout, calculating a second area of a process based on a design rule for the one or more devices and the first area, calculating a void area based on the first area and the second area, and calculating a score of the input layout based on the void area.

BRIEF DESCRIPTION OF THE DRAWINGS

Various example embodiments will be more clearly understood from the following detailed description taken in conjunction with the accompanying drawings in which.

DETAILED DESCRIPTION OF VARIOUS EXAMPLE EMBODIMENTS

Hereinafter, various example embodiments are described in detail with reference to the accompanying drawings.

Figure 1:
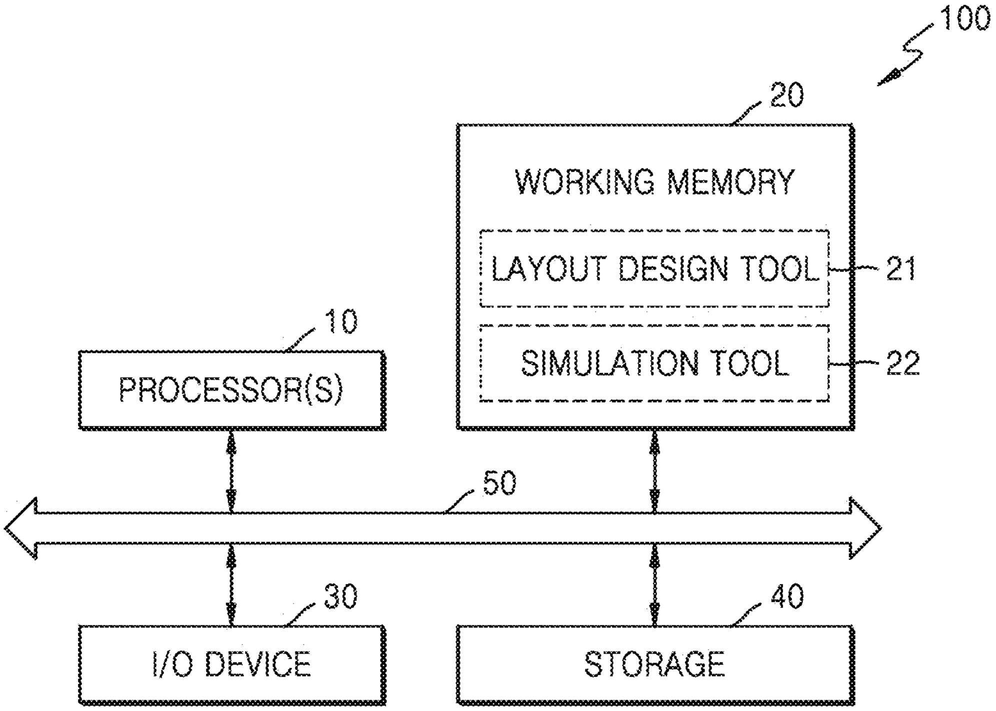
FIG. 1 is a block diagram illustrating a computer system for designing a semiconductor apparatus according to some example embodiments.

FIG. 1 is a block diagram illustrating a computer system 100 for designing a semiconductor apparatus according to some example embodiments.

Referring to FIG. 1, the computer system (or a layout design system) 100 may include at least one processor 10, a working memory 20, an input/output (I/O) device 30, and a storage 40. The at least one processor 10, the working memory 20, the I/O device 30, and the storage 40 may be connected to each other through a system interconnector 50 (e.g., a bus). Here, the computer system 100 may be provided as a dedicated device for designing a layout; however, example embodiments are not limited thereto. Also, the computer system 100 may be configured to run various design and verification simulation programs.

The processor 10 may execute software (e.g., one or more of application programs, operating systems (Oss), and device drivers) to be executed on the computer system 100. The processor 10 may execute an OS (not shown) loaded to the working memory 20. The processor 10 may execute various application programs to be driven based on the OS. For example, the processor 10 may execute a layout design tool 21 loaded to the working memory 20.

The working memory 20 may include volatile memories, such as static random access memory (SRAM) and/or dynamic random access memory (DRAM). However, the working memory 20 is not limited thereto and may additionally or alternatively include nonvolatile memories, such as one or more of phase-change RAM (PRAM), magnetic random access memory (MRAM), resistance RAM (ReRAM), ferroelectric RAM (FRAM), and flash memory.

An OS or application programs may be loaded into the working memory 20. When the computer system 100 boots, an OS image (not shown) stored in the storage 40 may be loaded to the working memory 20 according to a booting sequence. All I/O operations of the computer system 100 may be supported by the OS. Similarly, application programs may be loaded to the working memory 20 to be selected by a user or to provide basic services. For example, the layout design tool 21 for layout design according to some example embodiments may also be loaded to the working memory 20 from the storage 40.

The layout design tool 21 may have a biasing function capable of changing the shapes and/or the positions of certain layout patterns to be different from those defined by design rules. Alternatively or additionally, the layout design tool 21 may perform a design rule check (DRC) under a changed biasing data condition. Details of the design rule are described below.

Alternatively or additionally, the working memory 20 may be further loaded with a simulation tool 22 that performs optical proximity correction (OPC) on designed layout data.

The I/O device 30 controls inputs and/or outputs, such as for example a user's inputs and outputs from user interface devices. For example, the I/O device 30 may include a keyboard and/or a monitor to receive information from a designer. Using the I/O device 30, a designer may receive information on semiconductor regions or data paths requiring adjusted operating characteristics. Alternatively or additionally, a processing process and a processing result of the simulation tool 22 may be displayed on the I/O device 30.

The storage 40 is provided as a storage medium of the computer system 100. The storage 40 may store at least one of application programs, OS images, and various data. For example, the storage 40 may be provided as, include, or be included in a solid state drive (SSD), an embedded multimedia card (eMMC), or a hard disk drive (HDD). The storage 40 may include a NAND flash memory. However, without being limited thereto, and the storage 40 may include nonvolatile memories, such as one or more of PRAM, MRAM, ReRAM, FRAM, and the like.

The system interconnector 50 may be, or include, or be included in a system bus for providing a network inside the computer system 100. Through the system interconnector 50, the processor 10, the working memory 20, the I/O device 30, and the storage 40 may be electrically connected and may exchange data with each other. However, a configuration of the system interconnector 50 is not limited to the above description, and may further include mediation units for efficient management.

Figure 2:
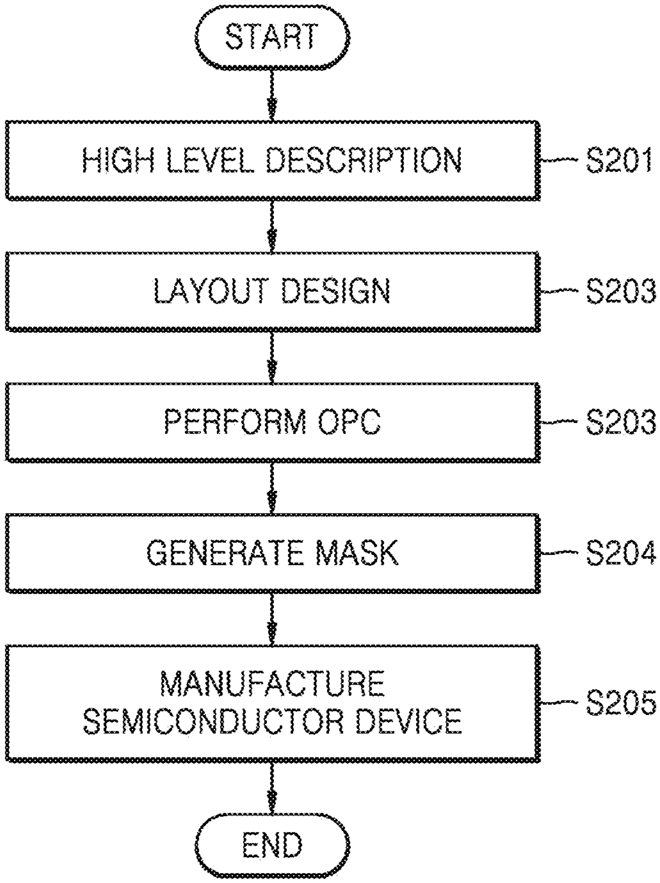
FIG. 2 is a flowchart illustrating a method of designing and manufacturing a semiconductor device, according to some example embodiments.

FIG. 2 is a flowchart illustrating a method of designing and manufacturing a semiconductor device, according to some example embodiments.

High level design of a semiconductor integrated circuit (IC) may be performed using the computer system 100 of FIG. 1 (S201). High-level design may refer to describing an IC to be designed in a high-level language of computer languages. For example, a high-level language, such as C or C++, may be used. Circuits designed by high-level design may be more specifically expressed by register transfer level (RTL) coding or simulation. Furthermore, code generated by register transmission level coding may be converted into a netlist and synthesized into all semiconductor devices. A synthesized schematic circuit may be verified by the simulation tool 22, and an adjustment process may be followed according to a verification result.

Layout design for implementing a logically completed semiconductor IC on a silicon substrate may be performed (S202). For example, layout design may be performed by referring to the schematic circuit synthesized in a high-level design and/or to a netlist corresponding thereto. The layout design may include a routing procedure of placing and connecting various standard cells provided in a cell library according to a design rule, such as a prescribed design rule.

A standard cell may refer to a configuration of a logic device (e.g., an inverter, a flip-flop, etc.) that performs a certain function. For example, the standard cell may include a plurality of transistors included in a logic element, and wirings connecting the transistors to one another.

The cell library for layout design may also include information on at least one of the operation, speed, and power consumption of standard cells. A cell library for expressing a certain gate level circuit as a layout is defined in many layout design tools Layout may be a procedure for defining a shape and/or a size of a pattern for configuring transistors and metal wirings so as to be actually formed on a silicon substrate. For example, in order to actually form an inverter circuit on a substrate such as a silicon substrate, layout patterns, such as one or more of PMOS, NMOS, N-WELL, gate electrodes, and metal wirings to be placed thereon, may be appropriately placed.

To this end, first, a suitable inverter may be searched for and selected from among inverters already defined in the cell library. In addition, routing may be performed on the selected and placed standard cells. Most of these series of processes may be performed automatically and/or manually by a layout design tool.

After routing, verification of the layout may be performed to determine whether there is a portion that violates the design rule. Examples of verification operations include DRC to verify whether a layout correctly conforms to the design rule, electrical rule check (ERC) to verify whether a layout is properly designed without electrical disconnection internally, and layout vs schematic (LVS) to check whether a layout matches a gate level netlist. DRC and LVS processes for area calculation according to some example embodiments are described below.

In addition, OPC may be executed (S203). Layout patterns obtained through layout design may be implemented on a silicon substrate using a photolithography process. Here, OPC may be technology for correcting a distortion phenomenon that may occur in a photolithography process For example, through OPC, a distortion phenomenon, such as refraction or a process effect that occurs due to characteristics of light during exposure using a layout pattern, may be corrected or at least partially corrected. While performing the OPC, a shape and/or position of the designed layout patterns may be finely changed.

Based on a layout changed by OPC, photomasks may be manufactured (S204). In general, photomasks may be manufactured by depicting layout patterns using a chromium thin film applied on a glass substrate.

A semiconductor device may be manufactured using the manufactured photomasks (S205). In the manufacturing process of the semiconductor device using the photomasks, various types of exposure and etching processes, and/or exposure and implantation processes, may be repeated. Through these processes, shapes of patterns configured in layout design may be sequentially formed on a silicon substrate.

Figure 3:
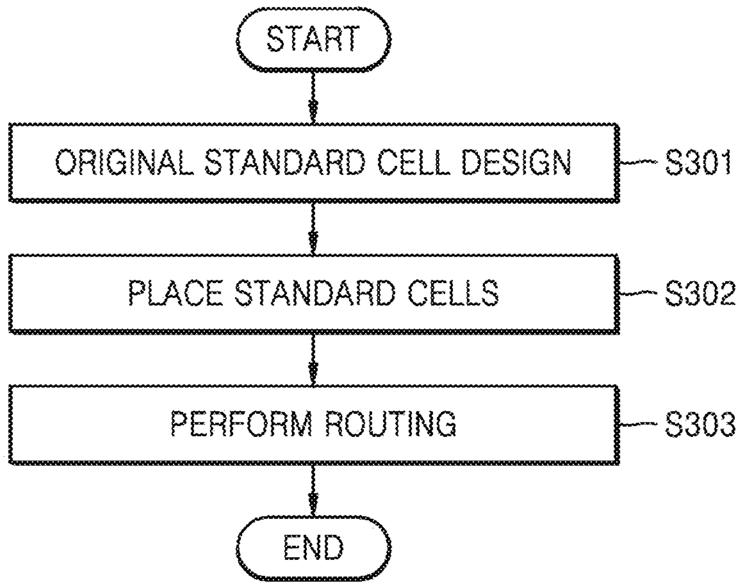
FIG. 3 is a flowchart illustrating in detail a method of designing a layout of FIG. 2 according to some example embodiments.

FIG. 3 is a flowchart illustrating a layout design method of FIG. 2 according to some example embodiments.

Referring to FIG. 3, an original standard cell layout may be configured using a layout design tool (S301). Configuring the standard cell layout may include configuring a wiring layout on a logic layout including logic transistors. The wiring layout may correspond to a metal layer to be formed on a semiconductor substrate. The logic layout may include layout patterns defining active regions. The active regions may include a PMOSFET region and an NMOSFET region. The PMOSFET region and the NMOSFET region may be apart from each other. The logic layout may include gate patterns extending across the PMOSFET region and the NMOSFET region. The gate patterns may be apart from each other, and the PMOSFET region, the NMOSFET region, and the gate patterns may constitute or be included in logic transistors formed on the semiconductor substrate.

The standard cell layouts configured as above may be stored in the cell library described above with reference to FIG. 2. Subsequently, the standard cell layouts stored in the cell library may be placed (S302). A plurality of standard cell layouts may be provided and placed side by side in a certain direction. Subsequently, routing with a higher wiring layout may be performed on the placed standard cell layout (S303) In some example embodiments, layout creation and cell placement are described in detail.

Figure 4:
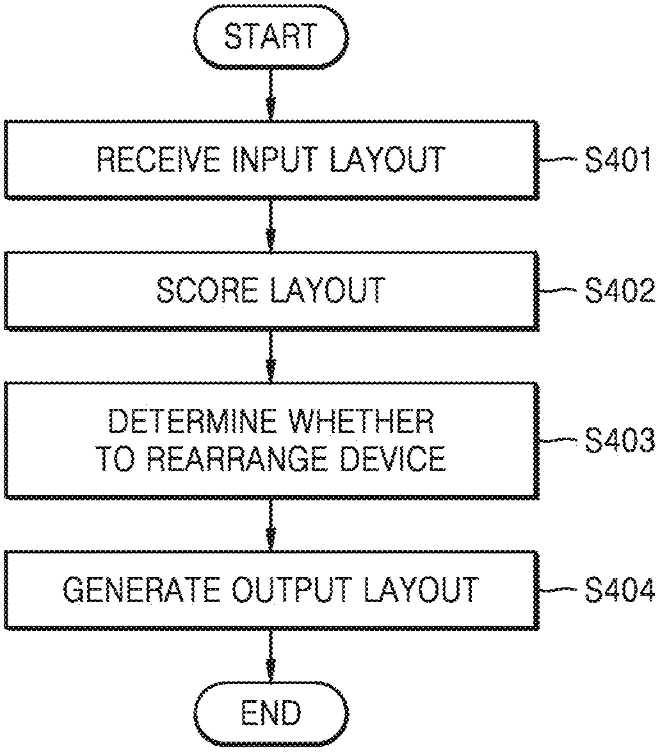
FIG. 4 is a flowchart illustrating in detail a process of outputting a layout through a rearrangement of devices according to some example embodiments.

FIG. 4 is a flowchart illustrating in detail a layout output process through rearrangement of devices according to some example embodiments.

Referring to FIG. 4, the design tool may receive an input layout generated based on devices arranged in an IC (S401). For example, the design tool may be the layout design tool 21 illustrated in FIG. 1. Based on the input layout data, the design tool may score the received input layout as is described below with reference to FIG. 5 (S402). The design tool may determine whether devices of the IC have to be rearranged based on the score of the received input layout (S403). For example, the design tool may rearrange the devices when a certain condition set as described below is not satisfied, and conversely, may not rearrange elements when a certain condition is satisfied.

After the process of determining whether to rearrange devices, the design tool may generate an output layout based on the determined layout (S404). As described above with reference to FIG. 3, routing may be performed based on the output layout.

Figure 5:
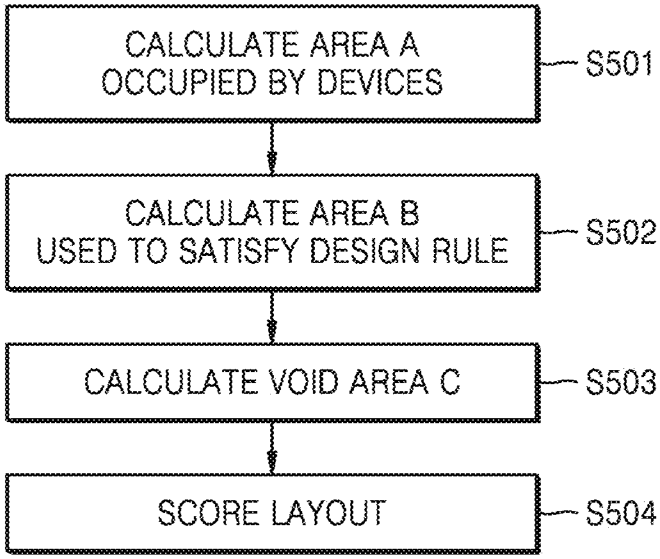
FIG. 5 is a flowchart illustrating in detail a method of scoring a layout, according to some example embodiments.

FIG. 5 is a flowchart illustrating a method of scoring a layout, according to some example embodiments.

Referring to FIGS. 4 and 5, the design tool may receive an input layout and score the layout (S402). In some example embodiments, after receiving the input layout, the design tool may calculate a first area A occupied by at least one circuit device included in an IC based on the input layout (S501). In this case, the first area A may correspond to an area implemented in the circuit. That is, when devices (e.g., transistors or resistors) constituting the synthesized schematic are implemented on the layout, the design tool may actually calculate an area occupied by the devices in the layout. During this process, for example, the design tool may calculate the first area A by referring to an LVS module as is described below. For example, the first area A may correspond to or be a function of the size of one or more of a channel of a transistor, a diode, a resistor, a capacitor, or the like.

In some example embodiments, the design tool may calculate, in addition to the first area A, an area to satisfy a design rule for determining whether it may be actually implemented in a process, for example, a second area B required or used within the manufacturing process of an IC (S502). For example, the second area B may correspond to an area required or used for the process. As described in detail with reference to FIGS. 7 and 8 below, a sufficient area is to be secured so that the designed IC may be physically implemented in the process, and the design tool may calculate the area used to satisfy the design rule. For example, the second area B may include one or more of a space of an active region, a space of a gate, overlap transistors in a well, and the like.

As described above, when the calculation of the first area A occupied by at least one circuit device included in the IC and the second area B necessary for or used for the manufacturing process of the IC are completed, the design tool may calculate an area representing or defining an empty space in the layout, that is, a void area C excluding the first area A and the second area B in the entire layout based thereon (S503).

The design tool may score the layout based on the void area C calculated based on steps S501 to S503 (S504). In some example embodiments, the calculation process of scoring the layout may be based on [Equation 1] below.

$$\text{Layout score}=(\text{total layout area}-\text{void area } C)/(\text{total layout area})\times 100 \quad \text{[Equation 1]}$$

As described above based on the layout score according to the layout scoring method according to S501 to S504, whether to rearrange devices may be determined (S403). As such, because a more consistent scoring process is performed on various types of different circuit layouts, the efficiency of a layout may be evaluated based on objective scores, and an improvement in the process of designing and/or fabricating the semiconductor device may be observed.

Figure 6:
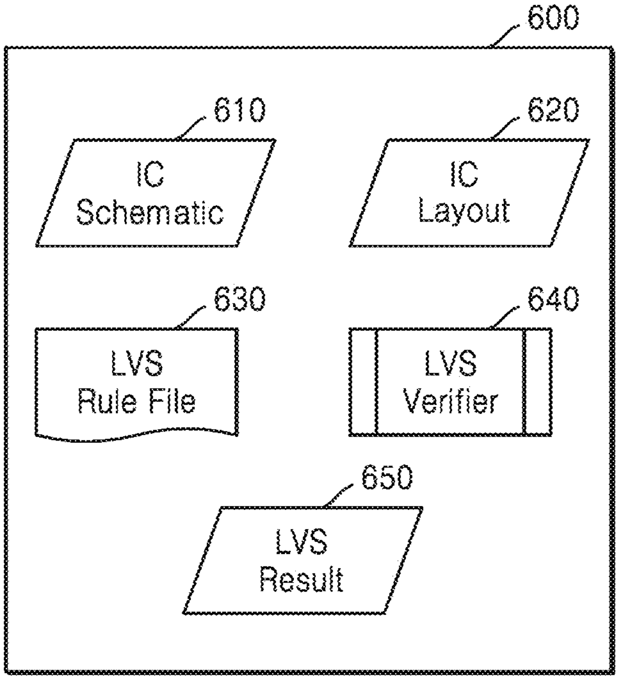
FIG. 6 is a block diagram illustrating a layout versus schematic (LVS) module for area calculation according to some example embodiments.

FIG. 6 is a block diagram illustrating an LVS module 600 for area calculation according to some example embodiments.

Referring to FIG. 6, for example, the LVS module 600 may be implemented in a computer-readable storage medium. The LVS module 600 may include IC wiring diagram data (or IC schematic) 610, IC layout data (or IC layout) 620, an LVS rule file 630, an LVS verifier 640, and an LVS result data (or LVS result) 650.

The LVS module 600 may include any storage medium that may be read by a computer, while being used to provide instructions and/or data to the computer. For example, the LVS module 600 may include one or more of magnetic and/or optical mediums, such as one or more of a disk, tape, a CD-ROM, a DVD-ROM, a CD-R disk, a CD-RW disk, a DVD-R disk, DVD-RW disk, and the like, volatile and/or non-volatile memories, such as one or more of RAM, ROM, a flash memory, and the like, non-volatile memories accessible through a USB interface, and microelectromechanical systems (MEMS). The LVS module 600 may be inserted into a computer, be integrated in a computer, and/or coupled to a computer through a communication medium, such as a network and/or a wireless link.

In some example embodiments, the IC wiring diagram data (schematic data) 610 may be data defining an IC including vertical memory cells. For example, the IC wiring diagram data 610 may be or include data in which a plurality of strings are defined as instances of a string symbol, and may be or include data in which memory cells and auxiliary cells placed at different levels are defined as instances of different cell symbols.

The IC layout data 620 may include topological data for defining a structure of an IC manufactured through a semiconductor manufacturing process. Also, the IC layout data 620 may include topological data regarding a plurality of layers included in the IC. For example, as described above with reference to FIG. 4, the IC layout data 620 may include layout data used in the processes (S401 and S402) of receiving and scoring the layout.

The LVS rule file 630, which is referred to when the LVS verifier 640 performs LVS verification, may define a device to recognize and extract the device from the layout data 620 of the IC. For example, the LVS rules file 630 may define a string device corresponding to a string symbol, or may define a plurality of cell devices respectively corresponding to memory cells placed at different levels. In some example embodiments, the design tool may use the LVS rule file 630 to calculate the first area A as described above. Devices recognized based on the IC layout data 620 are defined in the LVS rule file 630, so that the design tool may calculate the first area A based on area values of the devices defined as described above.

The LVS verifier 640 may generate the LVS result data 650 by comparing the IC wiring diagram data 610 with the IC layout data 20 based on the LVS rule file 630. The LVS verifier 640 may include a plurality of instructions for performing LVS verification, and a computing system and/or a processor included in the computing system may perform LVS verification by executing the instructions included in the LVS verifier 640.

Figure 7:
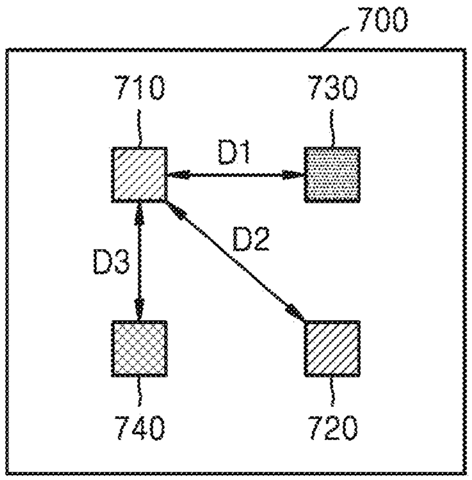
FIGS. 7 and 8 are plan views illustrating a layout for describing a design rule for area calculation according to some example embodiments.
Figure 8:
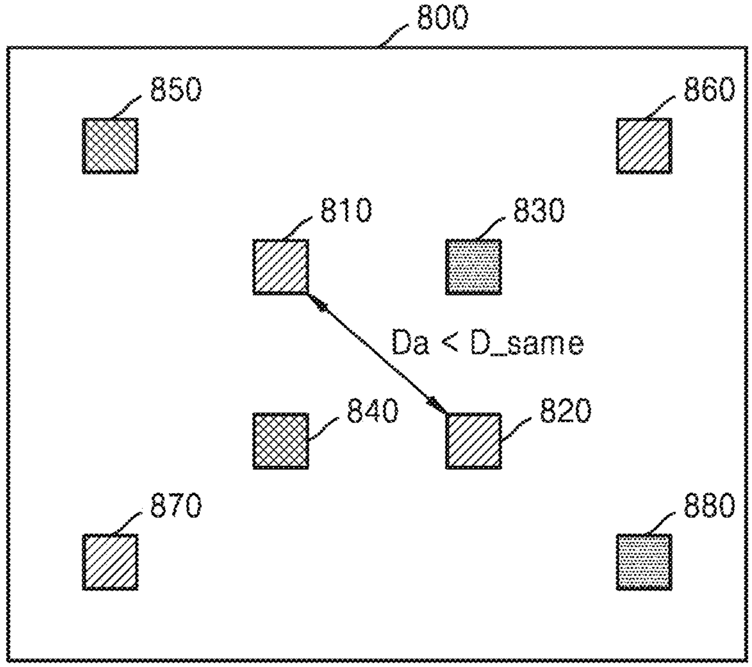

FIGS. 7 and 8 are plan views illustrating a layout for explaining a design rule for area calculation according to some example embodiments. In detail, FIG. 7 shows a plan view of a plurality of patterns (or first to fifth patterns) 710 to 740 formed based on a mask, and the patterns 710 to 740 may be formed on a layer.

A design rule may include D_same, which is a minimum distance (e.g., a minimum Euclidean distance) between two patterns formed on one layer based on the same mask, and may also include D_diff, which is a minimum distance (e.g., a minimum Euclidean distance) between two patterns formed on one layer based on different masks. Due, for example, to an effect of multi-mask patterning, D_diff may be less than D_same. A distance between a plurality of patterns in an IC layout according to an input layout may be greater than or equal to D_diff. A distance between patterns formed based on different masks may be a minimum distance that may be implemented in a given semiconductor manufacturing process, and accordingly, a distance between a plurality of patterns formed on one layer in the input layout may be designed to be greater than or equal to D_diff. A coloring operation is performed in which a plurality of patterns apart by at least D_diff or greater are matched to one of a plurality of masks, and coloring information may be generated.

A distance D1 between the first pattern 710 and the third pattern 730 respectively formed based on different masks may be greater than D_diff according to the design rule (e.g., D1>D_diff). If D1 is less than D_diff, the first pattern 710 and the third pattern 730 may be classified as patterns violating the design rule. Similarly, a distance D3 between the first pattern 710 and the fourth pattern 740 respectively formed based on different masks may be greater than D_diff according to the design rule (e.g., D3>D_diff). A distance D2 between the first pattern 710 and the second pattern 720 formed based on the same mask may be greater than D_same according to the design rule (i.e., D2>D_same). As in the above examples, the second area B described above may be calculated based on the design rule, such as D_same and/or D_diff, which are minimum distances between the devices and/or patterns that may be implemented in a manufacturing process according to the layout.

FIG. 8 is a plan view illustrating a layout 800 of an IC including patterns violating a design rule. As described above, a plurality of patterns formed on one layer may be matched to one of a plurality of masks, for example by labeling or coloring, and coloring information may be defined as a default when generating a layout of an IC or may be generated by a coloring algorithm of a design tool based on the layout of the IC. For description purposes and not for limitation, in FIG. 8, first, second, sixth, and seventh patterns 810, 820, 860, and 870 may be formed based on a first mask, third and eighth patterns 830 and 880 may be formed based on a second mask, and the fourth and fifth patterns 840 and 850 may be formed based on a third mask.

Referring to FIG. 8, the layout 800 of an IC may include the first to eighth patterns 810 to 880 formed in one layer. The first pattern 810 and the second pattern 820 formed based on the first mask may be apart by Da, and when Da is less than D_same according to the design rule, the first pattern 810 and the second pattern 820 may be classified as patterns violating the design rule.

As a method of complying with the design rule, when the first pattern 810 is matched to a mask different from the first mask, for example, the second mask, the first pattern 810 and the third pattern 830 may violate the design rule due to D_same according to the design rule. Also, when the first pattern 810 is matched to the third mask, the first pattern 810 and the fourth pattern 840 may violate the design rule due to D_same according to the design rule. As such, matching one of the violated patterns to another mask may generate new patterns that further violate the design rule, which may lead to a decrease in the performance of the semiconductor design and/or fabrication.

Alternatively, as another method of complying with the design rule, if the first pattern 810 is moved so that the first pattern 810 is farther away from the second pattern 820 than D_same, a distance between the first pattern 810 and other patterns adjacent to the first pattern 810, for example, the fourth pattern 840 or the fifth pattern 850, may decrease to violate the design rule due to D_diff according to the design rule. As such, moving a position of one of the violated patterns may generate new patterns that also violate the design rule.

Therefore, because a certain distance is required or expected between devices to avoid violation of the design rule, an area may be required or expected to satisfy the design rule, excluding an area of the device itself, to secure a minimum distance. Therefore, through the above process, the design tool may calculate the area required or expected to satisfy the design rule, for example, the second area B required for the manufacturing process of the IC as described above.

Figure 9:
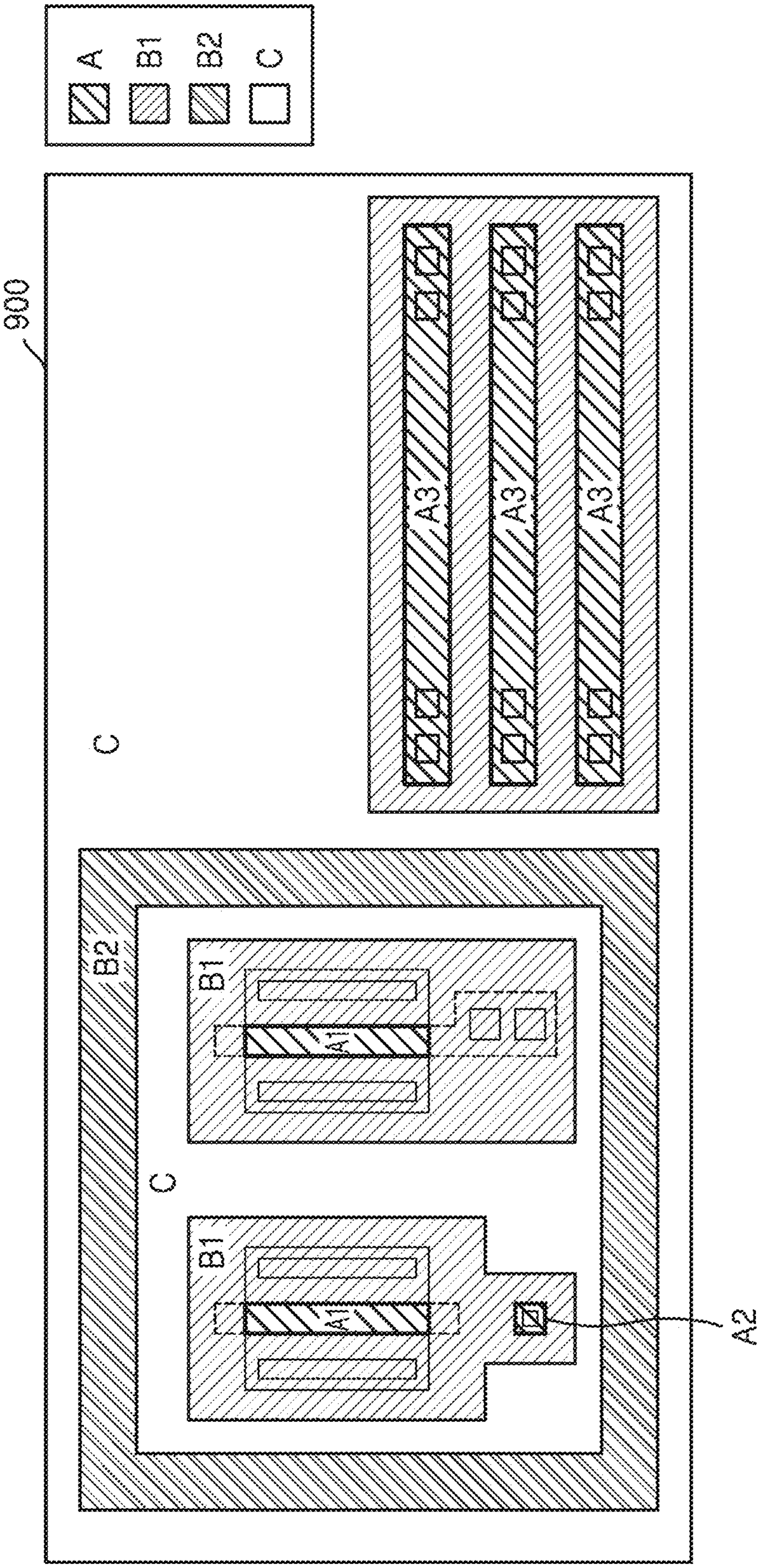
FIG. 9 is a layout plan view illustrating a method of scoring a layout, according to some example embodiments.

FIG. 9 is a layout plan view illustrating a method of scoring a layout 900 according to some example embodiments.

Referring to FIGS. 5 and 9, the design tool may calculate various areas to score the layout 900. As described above with reference to FIG. 5, the first area A, the second area B, and the void area C may refer to a first area A occupied by at least one circuit device included in the IC of the layout 900, a second area B required or used in the manufacturing process of the IC, and a void area C excluding the first area A and the second area B in the entire layout.

After receiving the layout 900, the design tool may calculate the first area A occupied by at least one circuit device included in an IC included in the layout 900. The first area A may include an area A1 occupied by a transistor, an area A2 occupied by a diode, and an area A3 occupied by a resistor. In some example embodiments, the area A1 occupied by the transistor may refer to an area or a region located between a source region and a drain region of the transistor. The source region and the drain region may each include a contact region. For example, the area A1 occupied by the transistor may refer to an area of a channel region in which a gate region and an active region of the transistor overlap each other. For example, the design tool may calculate the area occupied by the channel region by multiplying the channel width, length, and number of channels. As such, the design tool may perform calculation on the area A1 to calculate a schematic region occupied by the transistor. Alternatively or additionally, when calculating the area A3 occupied by the resistor, the design tool may calculate by including the contact region as shown in the drawing.

In addition, in some example embodiments, the second area B required in the manufacturing process of the IC may include, for example, a space area B1 for a region for placing the device itself and an overlap area B2 that is a region to be secured to place the transistor or the like, for example, in a well region. As described above, the space area B1 for the region for placing the device itself may refer to an area according to the design rule described above. For example, the space area B1 may refer to a minimum distance between two patterns formed in the layout 900 or may refer to an area in which devices are placed and normally operate (e.g., a source region, a drain region, and/or or a contact region extended from a channel for routing). The overlap area B2 may also be an area defined in the design rule, and may be an area indicating how far devices, such as transistors, should be apart to be placed in a process in the well region.

In some example embodiments, the void area C may be or correspond to or include or be included in an area defined by excluding the first area A and the second area B described in this drawing from the entire layout of the layout 900. For example, in the calculation of the first area A used for calculating the void area C, the area A1 occupied by the transistor may be calculated based on the area of the channel region. Alternatively, the area A3 occupied by the resistor may be calculated by including the contact region. In addition, the second area B required when calculating the void area C may be calculated by including the space area B1 and/or the overlap area B2. Alternatively or additionally, the total area of the layout 900 may be the total area of a single semiconductor chip, but is not limited thereto. For example, the total area of the layout 900 may be calculated in various manners according to definition. Similarly, calculation of the first area A and the second area B is not limited thereto, and may be performed in various manners depending on how the area occupied by each device is defined and how the area for the process is defined.

In addition, calculation of the areas constituting the layout of the design tool is not limited thereto, and may include calculation of areas of various devices not mentioned and areas required or used in the manufacturing process.

Figure 10:
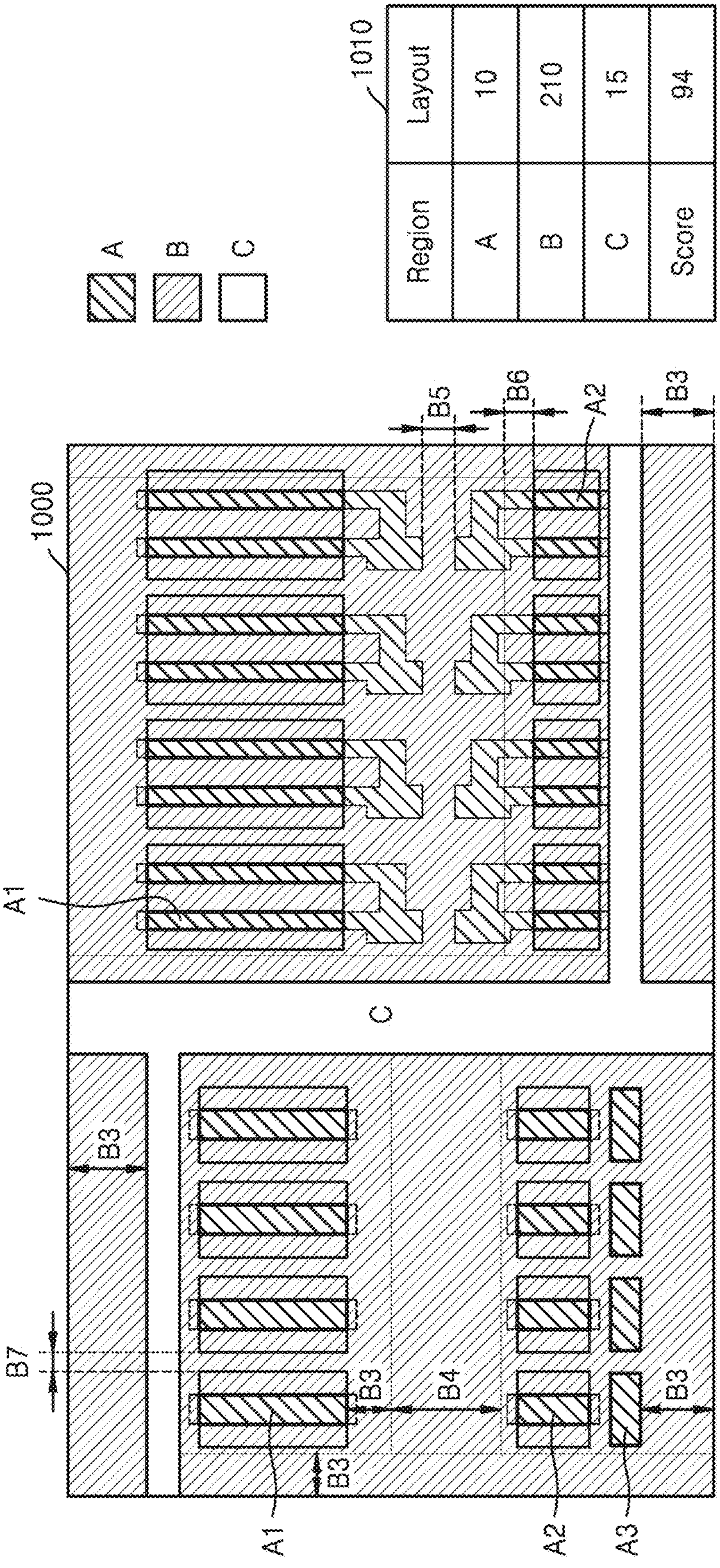
FIG. 10 is an example of a layout plan view illustrating a case in which a reference score is satisfied when a layout is scored according to some example embodiments.

FIG. 10 is an example of a layout plan view illustrating a case in which a reference score is satisfied when a layout 1000 is scored according to some example embodiments.

Referring to FIG. 10, in some example embodiments, a layout 1000 may include a number of regions such as a first area A occupied by at least one circuit device, a second area B required or used in a manufacturing process of an IC, and a void area C excluding the first area A and the second area B from the entire layout. This definition may be used in the same or similar manner in the examples of the layout plan view described herein.

As an example and not for the purposes of limitation, the first area A may include areas A1 and A2 occupied by the transistors and an area A3 occupied by a diode. As described above, the areas A1 and A2 occupied by the transistors may refer to an area of a channel region in which a gate region and an active region of the transistor overlap each other. In addition, the areas A1 and A2 occupied by the transistors may be areas occupied by a P-channel metal oxide semiconductor (PMOS) transistor or an N-channel metal oxide semiconductor (NMOS) transistor. Areas A1 and A2 occupied by the transistors may appear in various forms as shown. For example, when transistors share one source line and one drain line in a narrow width and are arranged vertically, an area of the layout occupied thereby may appear as area A1. Alternatively, when the transistors are horizontally arranged in a wide width, an area of the layout occupied thereby may appear as area A2.

In some example embodiments, the second area B may include a well overlap area B3, a well-active space area B4, a gate space area B5, a gate-active space area B6, and a transistor space B7. As described above with reference to FIG. 9, the well overlap area B3 may be an area indicating how far apart devices, such as transistors, should be placed in the well region in a process. The well-active space area B4 and the gate-active space area B6, which include an area indicating a space between active regions and an area indicating a space between a gate region corresponding to a target transistor and an active region, may refer to a minimum space to be secured for a corresponding device itself to operate according to designed performance or the device itself to be formed. For example, the well-active space area B4 may refer to a space between an active region $N_{active}$ in the case of an NMOS transistor and a well region $N_{well}$ of the NMOS transistor or a space between an active region $P_{active}$ in the case of a PMOS transistor and a well region $P_{well}$ of the PMOS transistor.

In addition, the gate space area B5 and the transistor space B7 may refer to an area required or used to secure a gate region and a minimum area for transistors to be apart from each other, respectively.

In some example embodiments, the void area C may be an area excluding all the first areas A1, A2, and A3 and the second areas B3, B4, B5, B6, and B7 described in this drawing from the total area of the layout 1000. The design tool may perform scoring on the layout 1000 based on a calculation result 1010 according to the areas A, B, and C, and a score of the layout 1000 calculated according to Equation 1 may be 94 points. For example, when a target reference score is set to 90 points, the score of the layout 1000 of this drawing satisfies a target value, and thus, the design tool may generate output layout data based on the layout design.

Figure 11:
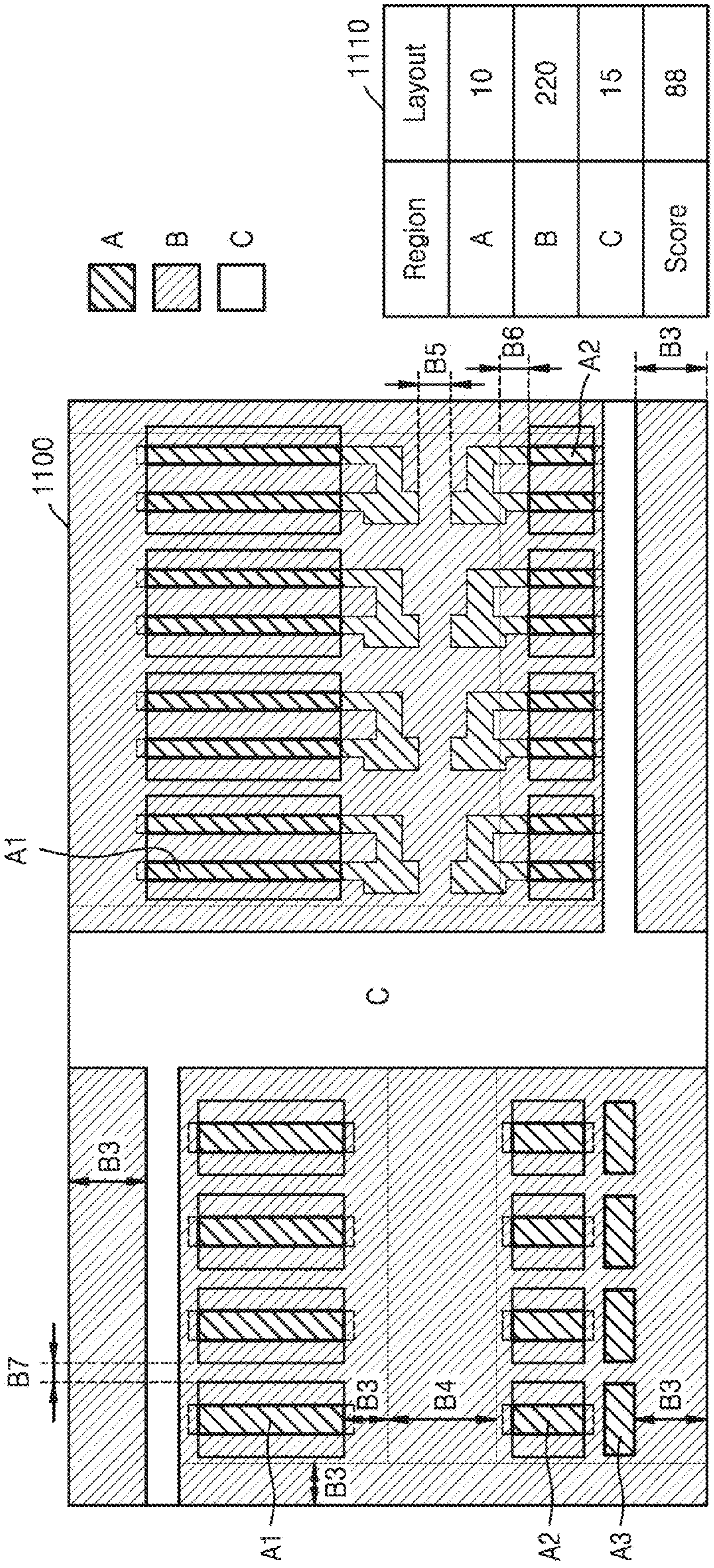
FIG. 11 is an example of a layout plan view illustrating a case in which a reference score is not satisfied when a layout is scored according to some example embodiments.

FIG. 11 is an example of a layout plan view illustrating a case in which a reference score is not satisfied when a layout 1100 is scored according to some example embodiments.

Referring to FIGS. 10 and 11, in some embodiments, the first area A, the second area B, and the void area C in the layout 1100 are described above with reference to FIG. 10, and thus, redundant descriptions thereof are omitted. The design tool may perform scoring of the layout 1100 according to Equation 1 based on a calculation result 1110 according to the areas A, B, and C as above, and a score of the layout 1100 may be, for example, 88. For example, when a target reference score is set to 90 points, the layout 1100 of this drawing does not satisfy a target value.

Figure 12:
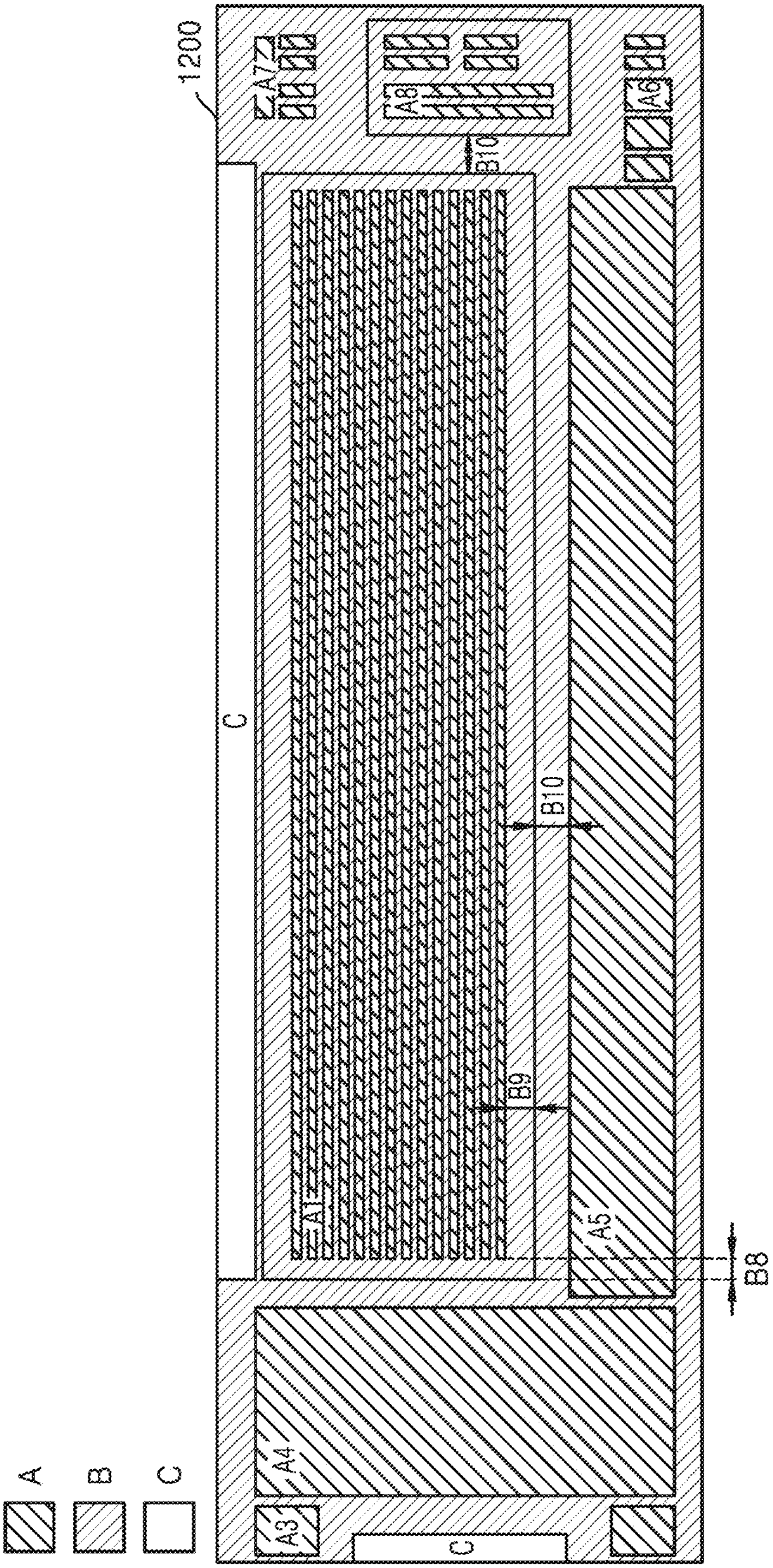
FIG. 12 is another example of a layout plan view illustrating a method of scoring a layout, according to some example embodiments.

FIG. 12 is another layout plan view illustrating a method of scoring a layout 1200, according to some example embodiments.

Referring to FIG. 12, in some embodiments, the first area A in the layout 1200 may include an area A1 occupied by a resistor, areas A3, A4, A5, and A7 occupied by a capacitor, and areas A6 and A8 occupied by a transistor. When implementing a resistor such as a serpentine resistor in a semiconductor process, for example, the resistor may be manufactured by utilizing an active region, a well region, and a gate region (e.g., Poly-Si is used) of each source or drain. A resistance in an IC may be configured by adjusting resistivity through doping and/or designing a region in which current does not flow. A process of generating resistance may be simultaneously performed in a process of forming an active region of a source or drain. Resistivity of a resistor using a gate region in which poly-Si is used (hereinafter, referred to as gate poly resistor (GP Res)) may be adjusted according to types of impurities and/or the amount of doping, and the resistor may have various resistance values therethrough. For example, the area A1 occupied by the resistor may refer to a region occupied by the gate poly resistor. The areas A3, A4, A5, and A7 occupied by the capacitor may refer to a region occupied by the capacitor, and here, the capacitor may refer to an NMOS transistor device used as a capacitor. The area A6 occupied by a transistor may refer to a region occupied by an NMOS transistor, and the area A8 occupied by a transistor may refer to a region occupied by a PMOS transistor.

The second area B may include a GP Res space area B8, a GP Res overlap area B9, and a GP Res-well space area B10. As described above with reference to FIG. 10, the GP Res space area B8 may refer to an area required to secure a gate poly resistor region, and the GP Res overlap area B9 may refer to a region of how far a GP Res device serving as a resistor has to be apart in a process in order to be placed Also, the GP Res-well space area B10 may refer to a minimum region for the GP Res device to be formed in a process or a minimum process condition for forming a mask pattern as designed.

In some example embodiments, the void area C is an area excluding all the first areas A1, A2 to A8 and the second areas B8, B9, and B10 described in this drawing from the total area of the layout 1200. The design tool may perform scoring of the layout 1200 based on a calculation result based on the areas A, B, and C as described above.

Figure 13:
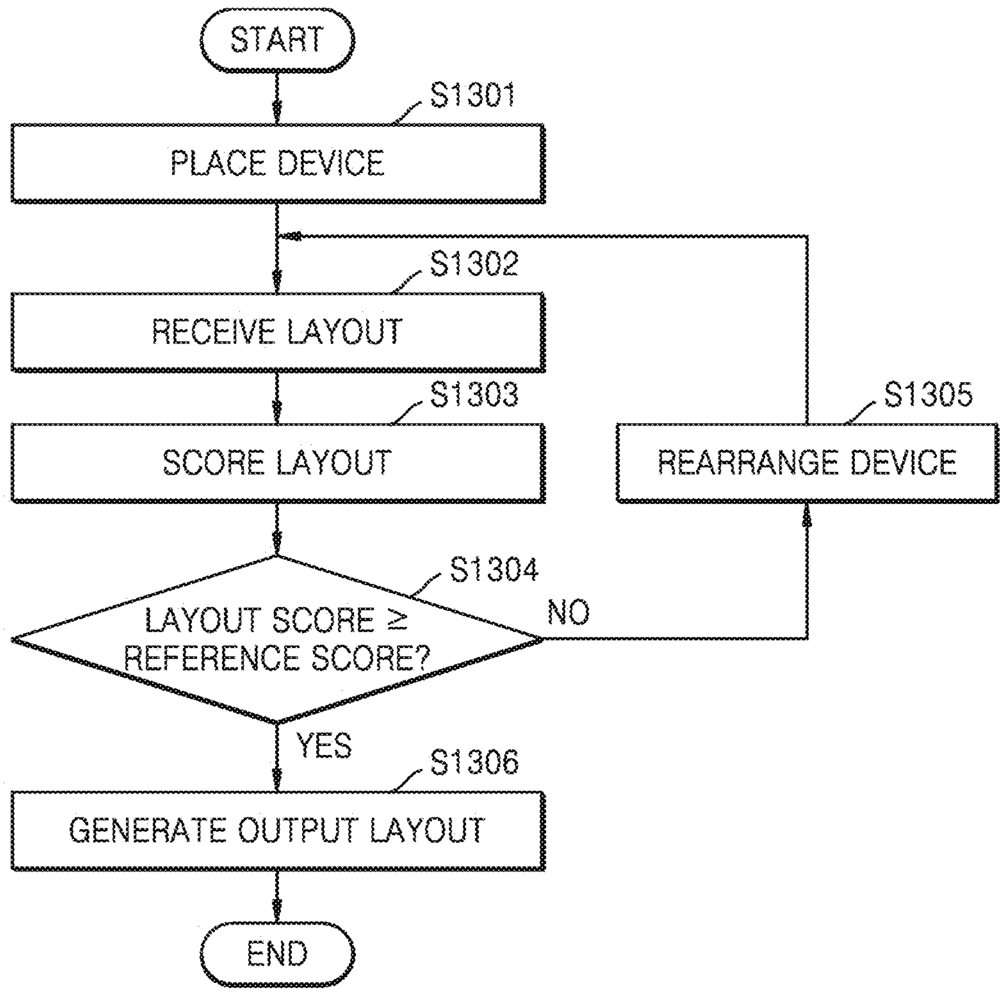
FIG. 13 is a flowchart illustrating a process of optimizing a layout according to layout scoring according to some example embodiments.

FIG. 13 is a flowchart illustrating a process of improving or optimizing a layout according to layout scoring according to some example embodiments.

Referring to FIG. 13, the design tool may generate an improved or optimized layout based on layout scoring according to some example embodiments. First, a user or the like may place various devices to design an IC (S1301). The design tool may receive a layout generated based on the devices placed on the IC and store the received layout (S1302 and S1303). A description thereof has been given above with reference to FIG. 4 and FIGS. 9 to 11 and is thus omitted here. The design tool may compare the score of the above layout with a set reference score (S1304).

For example, as a void area increases, more space may be wasted in the layout, and thus, the layout may be an inefficient layout. Consequently, in order to place the devices more efficiently in the layout, the user or the like may set a reference score and compare a layout score with the reference score, and accordingly, the design tool may generate a received layout as an output layout only when a layout score of the received layout is equal to or higher than the reference score (S1306). In some example embodiments, the reference score may be or be based on a score arbitrarily set by the user or the like. Alternatively or additionally, the reference score may be set or may be based on scores of previously generated layouts (e.g., an average or measure of central tendency of the scores of existing layouts). Alternatively or additionally, the reference score may be or be based on a score set using score data obtained while the design tool performs scoring of layouts. When the layout score is less than the reference score, the design tool may rearrange the devices (because the devices are relatively inefficiently arranged) (S1305).

As a result, the design tool may receive the layouts and may repeatedly rearrange the devices until a certain reference score is satisfied. Through this, empty space wasted in the layout may be reduced and the placement of the devices in the layout may be improved or optimized by more efficiently utilizing an available area.

Figure 14:
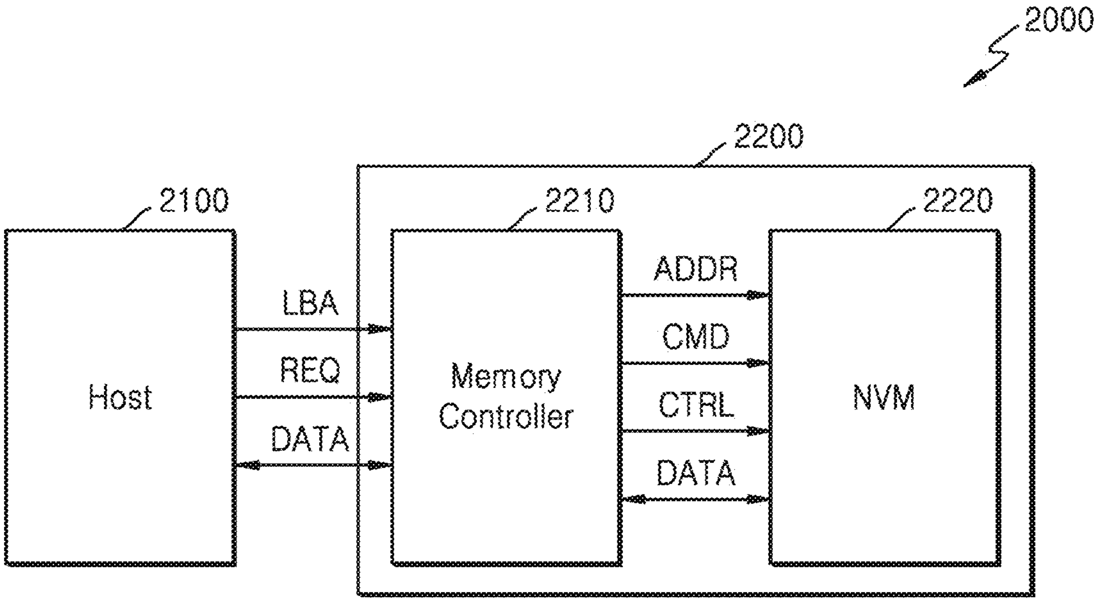
FIG. 14 is a block diagram illustrating a memory system to which a layout design method according to some example embodiments is applied.

FIG. 14 is a block diagram illustrating a memory system 2000 to which a layout design method according to some example embodiments is applied.

Referring to FIG. 14, the memory system 2000 may include a host 2100 and a memory device 2200. The memory device 2200 may include a memory controller 2210 and a nonvolatile memory (NVM) 2220 designed based on the layout design method according to some example embodiments. The host 2100 may be electrically connected to the memory device 2200. The host 2100 may provide a logical block address LBA and a request signal REQ to the memory device 2200, and may exchange data DATA with the memory device 2200. For example, the host 2100 may be connected to the memory controller 2210.

The host 2100 may include, for example, one or more of a personal computer (PC), a laptop, a mobile phone, a smartphone, a tablet PC, and the like.

The memory device 2200 may include the memory controller 2210 and the NVM 2220. The memory device 2200 may be integrated as a single semiconductor device. In the process of integrating the memory device 2200, when each of various components included in the memory device 2200 is designed, the layout design method according to some example embodiments may be used. For example, the memory device 2200 may include one or more of an embedded a universal flash storage (UFS) memory device, an eMMC, an SSD, a removable UFS memory card, a compact flash (CF) card, secure digital (SD), a micro-SD card, a mini-SD card, an extreme digital (xD) card, a memory stick, and the like to which the layout design method according to some example embodiments is applied.

The NVM 2220 may also include a NAND flash memory or a NOR flash memory to which the layout design method according to some example embodiments is applied, or one or more of PRAM, MRAM, FRAM, and resistive RAM (RRAM).

The memory controller 2210 may be connected to the NVM 2220 and control the NVM 2220. For example, the memory controller 2210 may provide an address ADDR, a command CMD, and a control signal CTRL to the NVM 2220 in response to the logical block address LBA and the request signal REQ received from the host 2100. That is, the memory controller 2210 may provide the signals to the NVM 2220 to control the NVM 2220 to write data therein or to read data therefrom. In addition, the memory controller 2210 may exchange the data DATA with the NVM 2220.

In some example figures, functional blocks within figures may be able to communicate with other functional blocks, in a wired network manner and/or wirelessly, to exchange information such as data and/or commands, in a one-way and/or multi-way (e.g. two-way and/or broadcast manner). The information may be sent serially and/or in a parallel manner, and/or may be digital and/or analog information; example embodiments are not limited thereto.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been particularly shown and described with reference to various example embodiments thereof, it will be understood that various changes in form and details may be made therein without departing from the spirit and scope of the following claims. Furthermore example embodiments are not necessarily mutually exclusive with one another. For example, some example embodiments may include one or more features described with respect to one or more figures, and may also include one or more other features described with respect to one or more other figures.

What is claimed is:

1. A method of designing a layout of a semiconductor device, the method comprising:

receiving an input layout of the semiconductor device;

scoring the input layout;

determining whether to rearrange at least one device of the semiconductor device based on the scoring; and generating an output layout based on a rearrangement, wherein the scoring includes:

calculating a first area occupied by one or more devices included in the semiconductor device in the input layout;

calculating a second area required in a manufacturing process based on a design rule for the one or more devices and the first area;

calculating a void area of the input layout based on the first area and the second area; and calculating a score of the input layout based on the void area.

2. The method of claim 1, wherein the calculating of the void area includes calculating a difference of a total area of the input layout less a sum of the first area and the second area.

3. The method of claim 2, wherein the calculating of the score of the input layout includes calculating the score of the input layout from a value obtained by dividing a difference between the total area of the input layout and the void area by the total area of the input layout.

4. The method of claim 1, wherein the determining of whether to rearrange at least one device of the semiconductor device includes comparing the score of the input layout with a reference score.

5. The method of claim 4, wherein the determining of whether to rearrange at least one device of the semiconductor device includes not performing a rearrangement in response to the score of the input layout being greater than or equal to the reference score.

6. The method of claim 4, wherein the determining of whether to rearrange at least one device of the semiconductor device includes:

in response to the score of the input layout being less than the reference score, repeating, rearranging the at least one device and scoring of the input layout based on a rearranged layout, until the score of the input layout is greater than or equal to the reference score.

7. The method of claim 4, wherein the reference score is set externally.

8. The method of claim 1, wherein the calculating of the first area includes calculating, in response to the at least one device including a transistor, an area occupied by the transistor based on a channel region in which a gate region and an active region of the transistor overlap each other.

9. The method of claim 8, wherein the calculating of the second area includes calculating a third area obtained by subtracting the area occupied by the transistor from an area according to the design rule for placing the transistor itself.

10. The method of claim 9, wherein the calculating of the second area includes calculating a fourth area, which is an area associated with satisfying the design rule allowing devices included in the semiconductor device to be placed in a well region.

11. The method of claim 10, wherein the calculating of the void area includes calculating the void area by subtracting a sum of the first area and of the second area from the total area of the input layout.

12. The method of claim 1, wherein the calculating of the first area includes:

calculating, in response to the one or more devices including a resistor, an area occupied by the resistor, including a contact region of the resistor; and calculating, in a case of the one or more devices excluding the resistor, an area occupied by the one or more devices based on a defined layout-versus-schematic (LVS) rule.

13. A method of realizing a computer for a layout design of an integrated circuit, the method comprising:

receiving an input layout of the integrated circuit;

calculating a first area occupied by one or more devices included in the integrated circuit in the input layout;

calculating a second area required in a manufacturing process based on a design rule for the one or more devices and the first area;

calculating a void area of the input layout based on the first area and the second area;

calculating a score of the input layout based on the first area, the second area, and the void area;

comparing the score of the input layout with a threshold value; and performing routing on the integrated circuit based on a comparison result.

14. The method of claim 13, wherein the calculating of the void area includes calculating a difference of a total area of the input layout less a sum of the first area and the second area.

15. The method of claim 14, wherein the calculating of the score includes calculating the score of the input layout from a value obtained by dividing the difference between the total area of the input layout and the void area by the total area of the input layout.

16. The method of claim 13, further comprising: in response to the score of the input layout being less than the threshold, repeating rearranging of at least one of the one or more devices and the calculating of the first area, the second area, the void area, and the score based on a rearranged layout, until the score of the input layout is greater than or equal to the threshold.

17. The method of claim 13, wherein the calculating of the first area includes calculating, in response to the one or more devices including a transistor, an area occupied by the transistor based on a channel region in which a gate region and an active region of the transistor overlap each other.

18. The method of claim 17, wherein the calculating of the second area includes calculating a third area obtained by subtracting the area occupied by the transistor from an area according to the design rule for placing the transistor; and calculating a fourth area, which is an area associated with satisfying the design rule allowing devices included in the integrated circuit to be placed in a well region.

19. A method of a layout design of an integrated circuit, the method comprising:

receiving an input layout of the integrated circuit;

calculating a score of the input layout;

comparing the score of the input layout with a reference score; and determining whether to rearrange the integrated circuit based on a comparison result, wherein the calculating of the score includes:

calculating a first area occupied by one or more devices included in the integrated circuit in the input layout;

calculating a second area required to be implemented in a process based on a design rule for the one or more devices and the first area;

calculating a void area based on the first area and the second area; and calculating a score of the input layout based on the void area.

20. The method of claim 19, wherein the determining of whether to rearrange includes in response to the score of the input layout being less than the reference score, repeating the rearranging of at least one of the one or more devices and the calculating of the score based on the rearranged layout, until the score of the input layout is greater than or equal to the reference score.

* * * * *